(12) United States Patent
Wang et al.

(10) Patent No.: US 7,678,610 B2
(45) Date of Patent: Mar. 16, 2010

(54) SEMICONDUCTOR CHIP PACKAGE AND METHOD OF MANUFACTURE

(75) Inventors: Chuen Khiang Wang, Singapore (SG); Hien Boon Tan, Singapore (SG); Anthony Yi Sheng Sun, Singapore (SG); Sin Nee Song, Singapore (SG); Steven Yu Feng Yao, Singapore (SG); Hua Hong Tan, Singapore (SG)

(73) Assignee: UTAC-United Test and Assembly Test Center Ltd., Singapore (SG)

( * ) Notice: Subject to any disclaimer, the term of this patent is extended or adjusted under 35 U.S.C. 154(b) by 0 days.

(21) Appl. No.: 11/260,091

(22) Filed: Oct. 28, 2005

(65) Prior Publication Data

US 2006/0192292 A1    Aug. 31, 2006

Related U.S. Application Data

(60) Provisional application No. 60/622,628, filed on Oct. 28, 2004.

(51) Int. Cl.
*H01L 21/00* (2006.01)
(52) U.S. Cl. .................. 438/109; 438/106; 438/118; 438/126; 438/127; 257/E21.001
(58) Field of Classification Search ............... 438/109, 438/113; 257/686, 777, E21.001
See application file for complete search history.

(56) References Cited

U.S. PATENT DOCUMENTS 5,804,874 A *  9/1998  An et al. ............... 257/676

| | | | | |
|---|---|---|---|---|
| 6,340,846 | B1 * | 1/2002 | LoBianco et al. | 257/783 |
| 6,686,656 | B1 * | 2/2004 | Koh et al. | 257/686 |
| 6,847,104 | B2 * | 1/2005 | Huang et al. | 257/685 |
| 6,894,381 | B2 * | 5/2005 | Hetzel et al. | 257/686 |
| 6,927,484 | B2 * | 8/2005 | Thomas et al. | 257/685 |
| 7,045,892 | B2 * | 5/2006 | Kyung | 257/723 |
| 7,116,000 | B2 * | 10/2006 | Hall et al. | 257/783 |
| 2002/0019073 | A1 | 2/2002 | Moon | |
| 2002/0027295 | A1 | 3/2002 | Kikuma et al. | |
| 2004/0038447 | A1 | 2/2004 | Corisis et al. | |
| 2005/0012195 | A1 * | 1/2005 | Go et al. | 257/686 |
| 2008/0088037 | A1 * | 4/2008 | Byun et al. | 257/784 |

* cited by examiner

*Primary Examiner*—Charles D Garber
*Assistant Examiner*—Angel Roman
(74) *Attorney, Agent, or Firm*—Sughrue Mion, PLLC

(57) ABSTRACT

A semiconductor chip package and method of making the same. A first chip unit includes a first substrate and a first IC chip electrically connected to the first substrate. A second chip unit includes a second substrate and a second IC chip electronically connected to the second substrate. An adhesive material is provided on a surface of the first IC chip and the second chip unit is mounted onto the surface of the first chip unit including the adhesive material so that at least a portion of the second structure is encapsulated by the adhesive material, thereby providing some encapsulation in the same step as mounting. The first chip unit and the second chip unit may be separated by a spacer which may also provide an electrical connection.

10 Claims, 12 Drawing Sheets

(12a)

(12b)

SEMICONDUCTOR CHIP PACKAGE AND METHOD OF MANUFACTURE

CROSS-REFERENCE TO RELATED APPLICATIONS

This application claims benefit under 35 U.S.C. §119 to U.S. provisional application No. 60/622,628 filed Oct. 28, 2004, the entire contents of which are incorporated herein by reference.

BACKGROUND OF THE INVENTION

1. Field of the Invention

The present invention relates to a package for a semiconductor chip and a method of forming the same.

2. Description of the Related Art

Semiconductors are materials that have characteristics of insulators and conductors. In today's technology, semiconductor materials have become extremely important as the basis for transistors, diodes, and other solid-state devices. Semiconductors are usually made from germanium or silicon, but selenium and copper oxide, as well as other materials are also used. When properly made, semiconductors will conduct electricity in one direction better than they will in the other direction.

Currently, emerging electronic product applications create a set of challenges for the IC packaging industry. Once the IC chips have been produced and encapsulated in semiconductor packages, they may be used in a wide variety of electronic appliances. The variety of the electronic devices which incorporate semiconductor packages has grown dramatically in recent years and includes cellular phones, portable computers, hand-held devices, and many others. Each of these devices typically includes a motherboard on which a number of semiconductor packages are secured to provide multiple electronic functions. As consumer demand increases, the size of these devices decreases and the cost is reduced. Therefore, it is increasingly desirable to reduce the profile of the integrated semiconductor packages so that the resultant electronic systems can be incorporated into more compact devices and products.

Recently, multi-chip packaging, which is a special field of IC packaging that relates to the assembly of multiple semiconductor chips within a single IC package entity, has become increasingly popular. This popularity is driven by an industry demand to package more functional silicon content into a smaller package at a lower cost. Packaging two or more silicon chips within a single package reduces the related cost and also reduces the area required on the printed circuit boards, on which the IC package is mounted. In addition, multi chip packaging enables close proximity of chips resulting in shorter electronic signal paths between chips in the package. This reduces electronic signal travel time and improves overall speed and performance. Further, multi-chip packages save considerable mounting area, thus increasing valuable layout flexibility.

Multi-chip packages, in combination with BGA technology, are viewed as part of the solution for the widening gap between silicon I/O density and performance and the material capabilities of the package and board/substrate structure. Multi-chip packages can be viewed as standard single-chip packages modified to accommodate both multiple chips and passive components in order to provide the user with higher functionality integration. Typically, most multi-chip packages incorporate between two and six chips and are packaged in a conventional BGA.

The advantages of multi-chip packaging are numerous. For example, it allows for greater functionality in a time-to-market window that cannot be met through silicon integration. Effective use of multi-chip packages yields increased density and performance and reduced size and weight at the board or system level, while also reducing board area and routing complexity. Often, board layer reduction offsets the additional costs of using multi-chip packages. Additional benefits of multi chip packaging include design optimization through use of the most cost-effective silicon solutions and the ability to assemble packages utilizing different semiconductor technologies, die geometries, or types of chips in the same package.

This special field of IC packaging increases the value of high-speed designs, assembly processes and materials incorporated into a multi-chip package. Packaging chips together in this manner also facilitates the process of assembling stacked die or multi level, two-sided packages. The incorporation of different interconnection technologies, such as flip-chip or wire bond, into the multi-chip package is easily accommodated using this technology.

Therefore, improved multi-chip package designs and more economical and efficient methods of producing such packages are desired.

SUMMARY OF THE INVENTION

One aspect of the invention involves a method of forming a chip package including providing a first chip unit comprising a first IC chip and a first substrate, wherein the first IC chip is electrically connected to the first substrate through an opening in the first substrate; providing a second chip unit comprising a second IC chip and a second substrate, wherein the second IC chip is electrically connected to the second substrate through an opening in the second substrate; wherein each of the first substrate, the first IC chip, the second substrate and the second IC chip have first and second planar surfaces and the second planar surface of the first IC chip is mounted to the first planar surface of the first substrate and the second planar surface of the second IC chip is mounted to the first planar surface of the second substrate. The method also includes providing an adhesive on the first planar surface of the second IC chip and mounting the second planar surface of the first substrate on the first planar surface of the second IC chip wherein at least a portion of the second planar surface of the first substrate which contacts the adhesive is unencapsulated before mounting.

The entire second planar surface of the first substrate may be unencapsulated before mounting.

The first chip unit may be formed by singulating the first chip unit from a series of chip units.

Singulating of the first chip unit may be performed by at least one of snap break or laser cut technology.

The method may also include electrically connecting the first substrate and the first IC chip through bonding wire formed before singulating of the first chip unit.

The method may also include a step of securing the bonding wire before singulating the first chip unit.

The method may also include securing the bonding wire comprises dispensing epoxy on the bonding wire and curing the epoxy.

The method may also include dispensing the epoxy only over the bonding wire.

The method may also include the first chip unit moving only laterally after the step of singulating the first chip unit and before the step of mounting on the second chip unit.

The method may also include flipping the first chip unit after the step of singulating the first chip unit and before the step of mounting the first chip unit on the second chip unit.

The method may also include depositing the adhesive on the second IC chip in two portions, one portion at each of two opposite ends of the first planar surface of the second IC chip.

The method may also include forming a spacer separating the first substrate and the second substrate.

The spacer may be a solder ball.

The spacer may electrically connect the first substrate and the second substrate.

The method may also include forming the spacer by depositing solder on the first substrate and depositing solder on the second substrate so that the solder on the first substrate and the solder on the second substrate connect during mounting of the first chip unit on the second chip unit.

According to another aspect of the invention, a chip package includes a first chip unit comprising a first substrate and a first IC chip electrically connected to the first substrate through an opening in the first substrate; a second chip unit mounted to the first chip unit and comprising a second substrate and a second IC chip electronically connected to the second substrate through an opening in the second substrate; and a spacer maintaining a space between the first chip unit and the second chip unit.

The spacer may include an electrical conductor which electrically connects the first substrate and the second substrate.

The spacer may be a solder ball.

The first substrate, the first IC chip, the second substrate and the second IC chip may have first and second planar surfaces and the second planar surface of the first IC chip may be mounted to the first planar surface of the first substrate and the second planar surface of the second IC chip may be mounted to the first planar surface of the second substrate;

The second planar surface of the first substrate may be mounted to the first planar surface of the second IC chip The solder ball forming the spacer may be formed on the first planar surface of the second substrate and the second planar surface of the first substrate and the chip package may also include other solder balls formed on the second planar surface of the second substrate to provide an external output and the other solder balls may be electrically connected to the first and second IC chips.

The first substrate and the first IC chip may be electrically connected through bonding wire and the bonding wire is secured by an epoxy.

Another aspect of the invention involves a method of forming a chip package including providing a first chip unit comprising a first substrate and a first IC chip electrically connected to the first substrate through a hole in the first substrate; providing a second chip unit comprising a second substrate and a second IC chip electronically connected to the second substrate through a hole in the second substrate; providing an adhesive material on a surface of the first IC chip; and mounting the second chip unit onto the surface of the first chip unit including the adhesive material so that at least a portion of the second chip unit which was unencapsulated before mounting is encapsulated by the adhesive material.

BRIEF DESCRIPTION OF THE DRAWINGS

The above aspects and features of the present invention will be more apparent by describing exemplary embodiments of the present invention with reference to the accompanying drawings, in which.

Figure 1A:
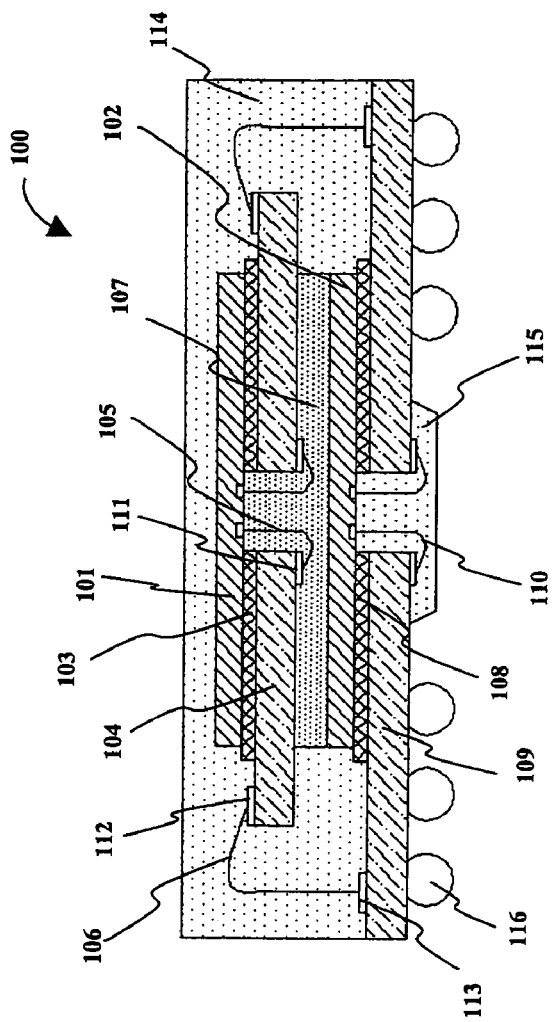
FIG. 1a is a sectional view exemplary embodiment of an IC package.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way. Throughout the drawings for explaining the exemplary embodiments, those components having identical functions carry the same reference numerals for which duplicate explanations will be omitted.

FIG. 1a illustrates an exemplary embodiment of an IC package 100 according to the present invention. As shown in FIG. 1a, in the present exemplary embodiment the package 100 consists of two IC chips, namely IC chip 101 and chip 102 assembled within the package 100. The IC chip 101 is first attached to the substrate 104 with an adhesive component 103. The adhesive component 103 may be in the form of non-conductive adhesive tape, film or paste in direct contact with active surface of chip 101. A small window opening on substrate 104 enables bonding wire 105 to electrically connect bonding pads on the chip 101 to an electrically conductive element 111 on the substrate 104. The electrically conductive element 111 may be in the form of copper plate with a gold plated surface to enable the electrical connection. The conductive element 111 forms an electrical path within the substrate 104 to another conductive element 112 in the opposite of substrate 104.

The substrate 104 is then attached to the back of the IC chip 102, through a non conductive adhesive component 107. The IC chip 102 is attached to another substrate 109, through similar concept as described earlier. In FIG. 1a, an adhesive component 108 connects the chip 102 and substrate 109. Also, a bonding wire 110 makes the electrical connection between the chip 102 and substrate 109.

The signal from substrate 104 is electrically connected to substrate 109, through bonding wire 106 that makes an electrical path between the conductive element 112 and conductive element 113. The encapsulation 114 and encapsulation 115 provide sealing and protection to the various components within. The bonding wire 110 and bonding wire 106 may form another electrical connection with solder balls present on the bottom surface of substrate 109. As shown in FIG. 1a, solders ball 116 are attached to the substrate 109. These solder balls can receive an electric signal from electrically conductive element 113, which is attached to the IC chip 101. The solder balls also can receive a signal from IC chip 102. Therefore, the solder ball 116 may be soldered to a printed circuit board to send an output from the IC chip package 100 externally.

Figure 1B:
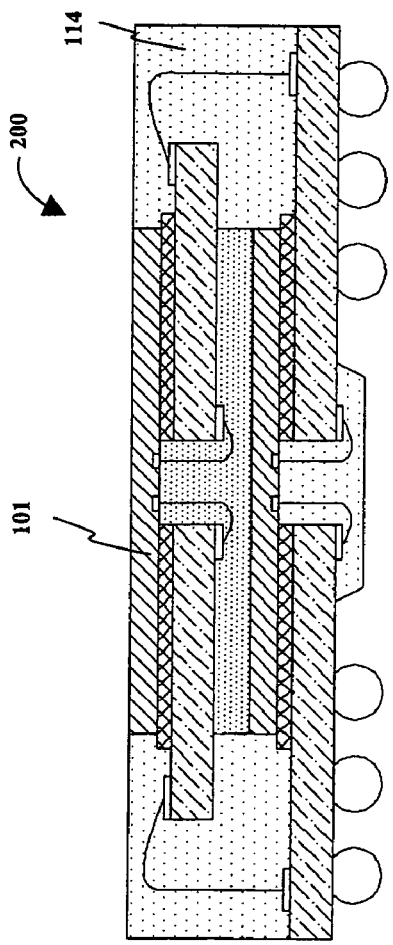
FIG. 1b is a modification of the exemplary embodiment of the IC package of FIG. 1a in which a surface of the IC chip is in level with an encapsulation.

FIG. 1b shows a modification to the exemplary embodiment shown in FIG. 1a. In the exemplary embodiment of the IC chip package 200 shown in FIG. 1b, the non-active surface of IC chip 101 is on the same plane as the top surface of encapsulation 114, i.e. exposed externally, without affecting the original function. Making the non-active surface of IC chip 101 on the same plane as the top surface of the encapsulation 114 leads to a lower total height of IC package 200.

Figure 2:
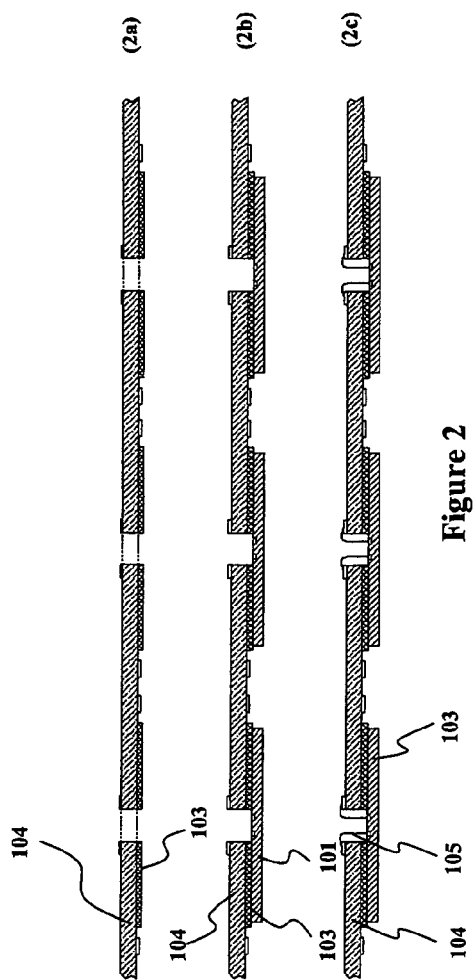
FIGS. 2a-2c illustrate an exemplary embodiment of part of the manufacturing process of an IC chip package.

FIG. 2a, 2b and 2c show an exemplary embodiment of a manufacturing process of the chip units, i.e. semi-finished IC packages including a substrate connected to an IC chip, which may be further processed and connected together to form a multi-chip IC package. In the exemplary embodiment shown in FIGS. 2a-2c, the substrate 104 may come in a semi-finished form with similar elements as those of FIG. 1a populated in an array format across the substrate panel, including substrate 104. The substrate 104 may have the adhesive component 103 pre-attached on it as shown in FIG. 2a.

As shown in FIG. 2b, the IC chip 103 is then attached to substrate 101 through the adhesive component 103. The substrate panel may form array of IC chips with similar structure as shown in FIG. 2b. FIG. 2c shows another step, in which the chips undergo a wire bonding process. In the wire bonding process, bonding wire 105 forms an electrical path between the IC chip 103 and the substrate 104 as shown in FIG. 2c.

Figure 3:
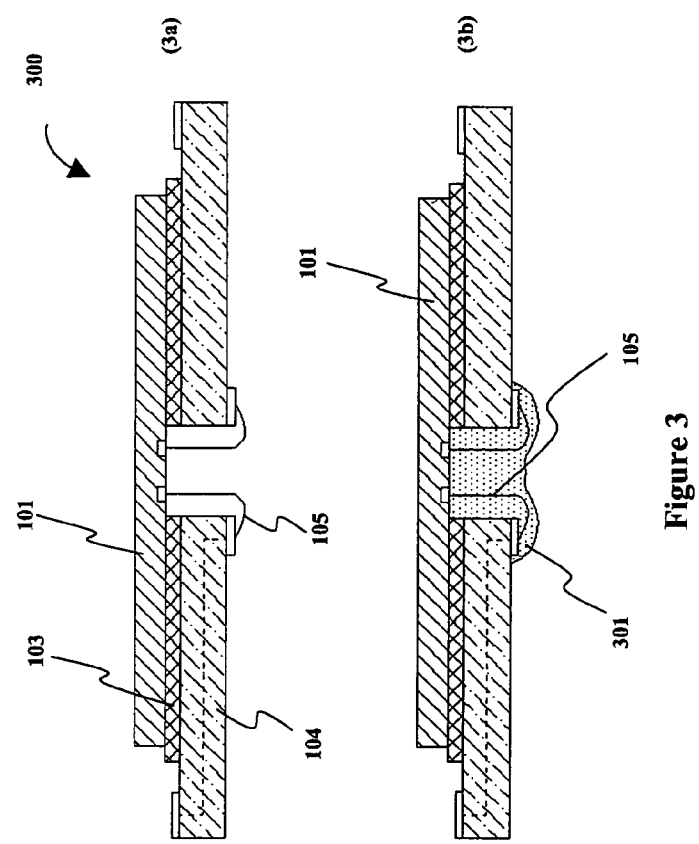
FIGS. 3a and 3b are sectional view of exemplary embodiments of IC chip units including a single substrate and IC chip.

The array of chips are further isolated by mechanical method or similar isolation technology to become a semi-finished package as illustrated in FIG. 3a. There are several manners in which the packages may be isolated. For example, there may be a groove cut in the substrate so that they may be snap broken or they may be cut apart using laser cut technology. FIG. 3b shows an alternative process, of which a non-conductive element 301 protects the bonding wire 105 as illustrated, prior to isolation of the package from the substrate panel. The non-conductive element 301 may be in the form of a gel, epoxy, paste or equivalent sealant materials; and may be dispensed accordingly with conventional liquid dispensing, printing or plastic injection technology for the desired purpose.

Figure 4:
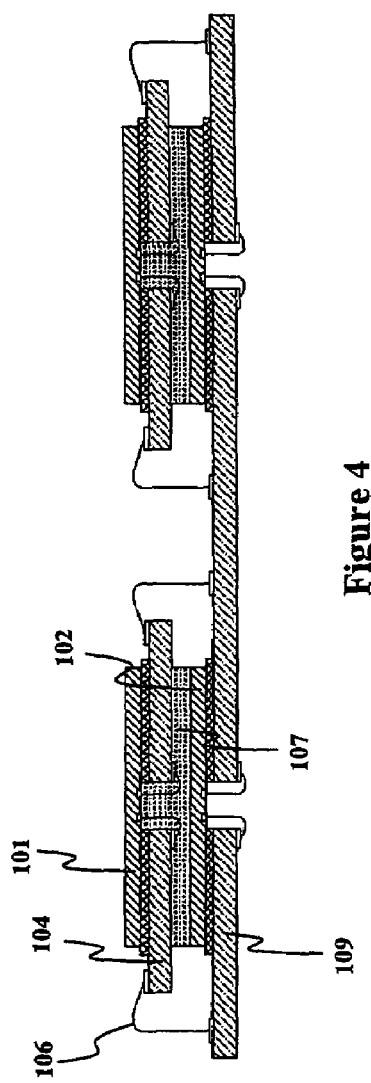
FIG. 4 shows a state of an exemplary embodiment of the IC package in which a first and a second IC chips have been attached.

The semi-finished package 300 as illustrated in FIG. 3a and 3b, is further attached to another IC chip 102 as shown in FIG. 4, through adhesive component 107. The IC chip 102 is mounted to the substrate 109, through similar manufacturing steps as those described with respect to FIGS. 2a to 2c.

Figure 5:
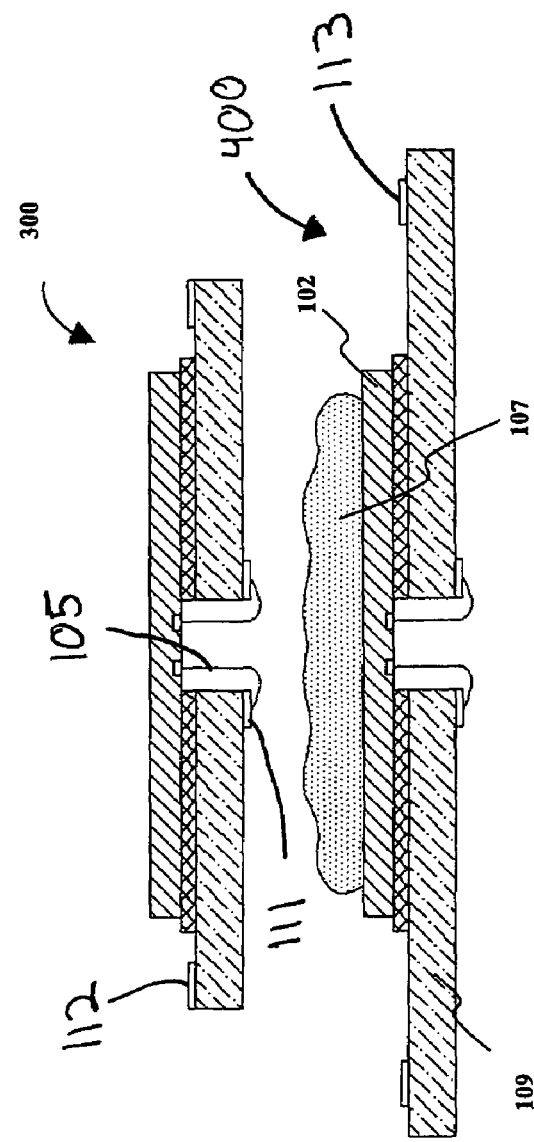
FIG. 5 illustrates a method of attaching a first IC chip to a second IC chip through an adhesive component.
Figure 6:
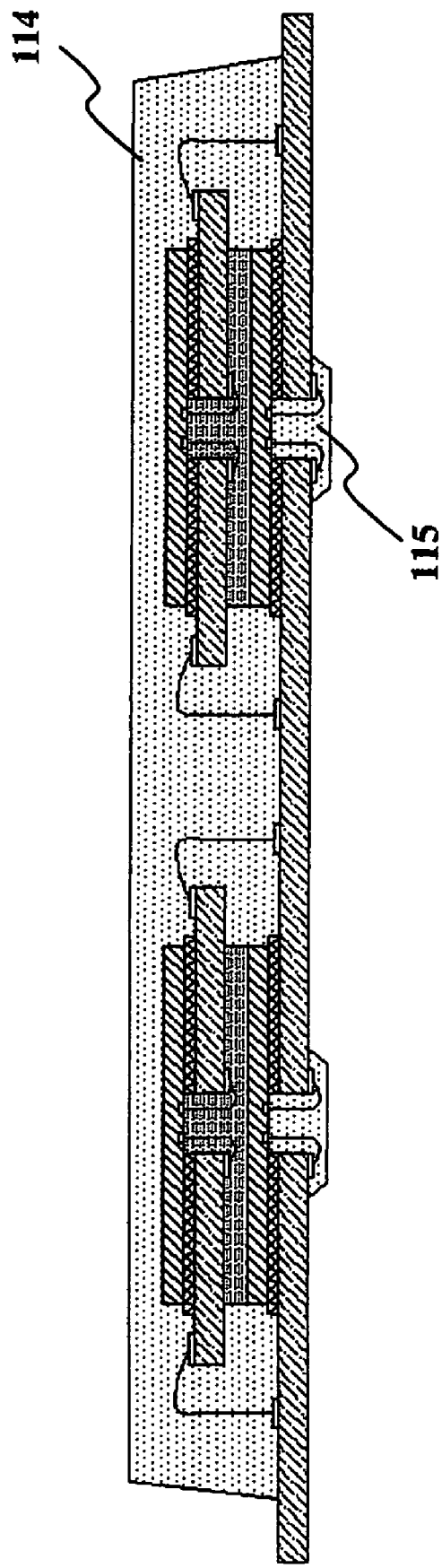
FIG. 6 illustrates the states of assembly of an exemplary embodiment of the IC chip package in which a first and second IC chips have been attached and encapsulated.

FIG. 5 shows a method for attaching IC chip 102 and IC chip 103. In the method shown in FIG. 5, adhesive component 107 is pre-dispensed onto the die back of IC chip 102. IC chip 103 with substrate 104 is then attached to the IC chip 102 after the adhesive component 107 is provided on the IC chip 102. This forms a semiconductor package with two chips, as shown, for example, in FIG. 4. When adhesive 107 is placed on the IC chip 102 connecting it to IC chip 103, the bonding wire 105 does not have to be encapsulated before assembling the IC chips together. This allows for the use of one less assembly process and one less material than if encapsulation is required before assembling the chips together. As shown in FIG. 4, bonding wire 106 can be used to provide an electrical path between the semi-finished IC package 300 to the bottom layer substrate 109. The substrate panel with array of IC chips and semi-finished packages then be encapsulated by typically plastic transfer molding or encapsulation methods as shown in FIG. 6.

Figure 7:
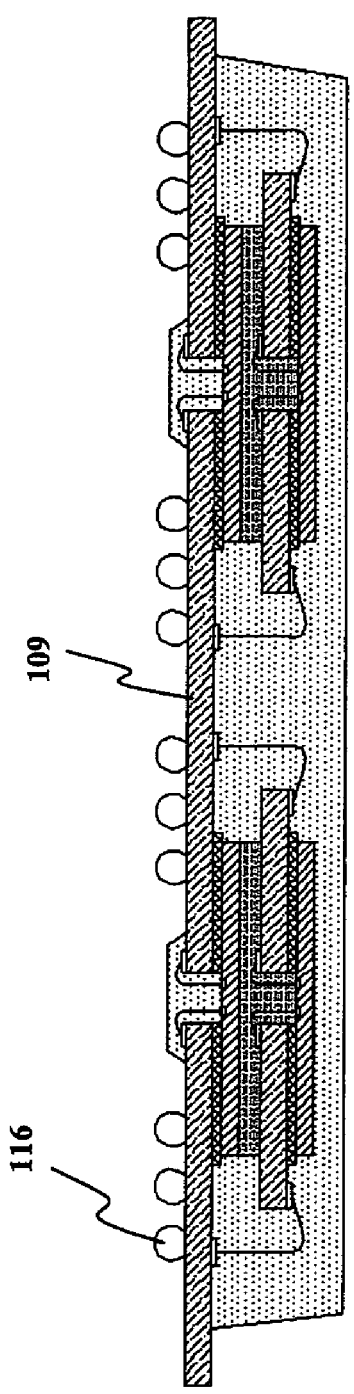
FIG. 7 illustrates the IC chip package of FIG. 6 in which solder balls have been attached to a lower substrate.

Later, solder balls may be mounted to the substrate 109 as shown in FIG. 7. This can be done before or after the final package is singulated or isolated.

Figure 8:
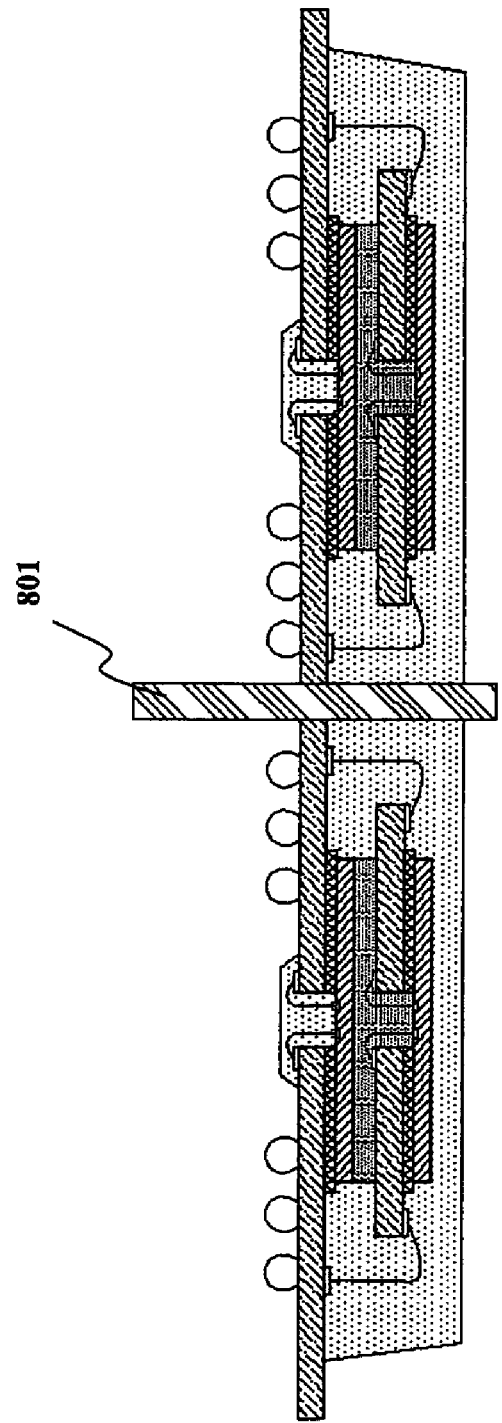
FIG. 8 illustrates the IC chip package of FIG. 7 wherein chip packages are being singulated.

There are several methods by which the final package may be isolated. FIG. 8 illustrates a method of isolating the final package through a mechanical process. In the example of FIG. 8 a cutting or sawing blade 801 is used to singulate the packages. After the packages are isolated, they have the structure as shown in FIG. 1a or 1b.

Figure 13:
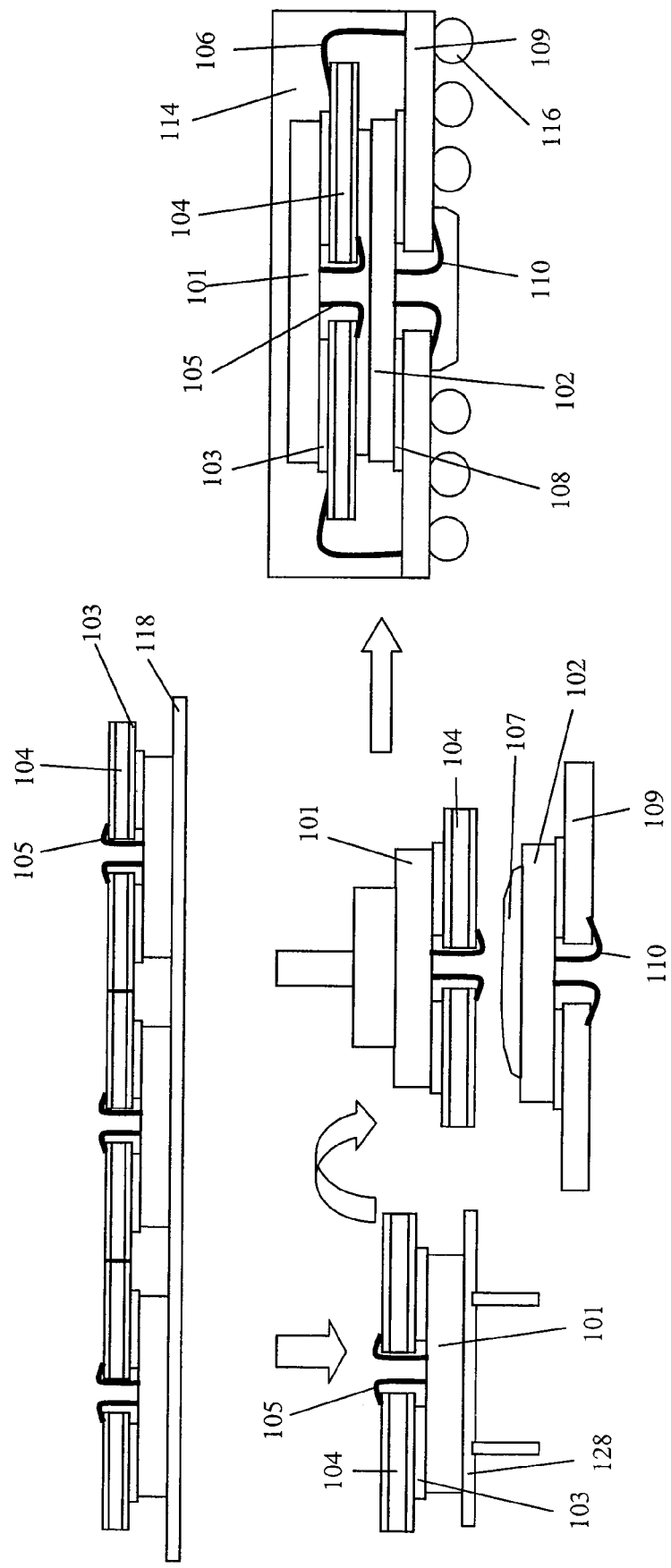
FIG. 13 illustrates a detailed method of manufacturing an IC chip package according to an exemplary embodiment of the present invention.

FIG. 13, illustrates a detailed method of manufacture for creating an IC chip package in which an adhesive 107 is used to help encapsulate part of the semi-finished IC-package 300 (top chip unit), similar to that explained with respect to FIG. 5. In the method of FIG. 13, a plurality of chips and substrates are mounted to a wafer mount tape 118. A chip unit, including the substrate 104 and the IC chip 101 are then ejected from the tape 118, for example by ejecting device 128, and flipped over. Similar to as shown in FIG. 5, thermoplastic adhesive 107 is placed on a bottom chip unit 400, which includes IC chip 102 and substrate 109. Specifically an adhesive 107 is placed on a top surface of IC chip 102, and top chip unit 300 is attached to the bottom chip unit 400 at the adhesive 107. In this manner chip unit 300 is at least partially encapsulated in the same process of attaching together the IC Chips.

Figure 14:
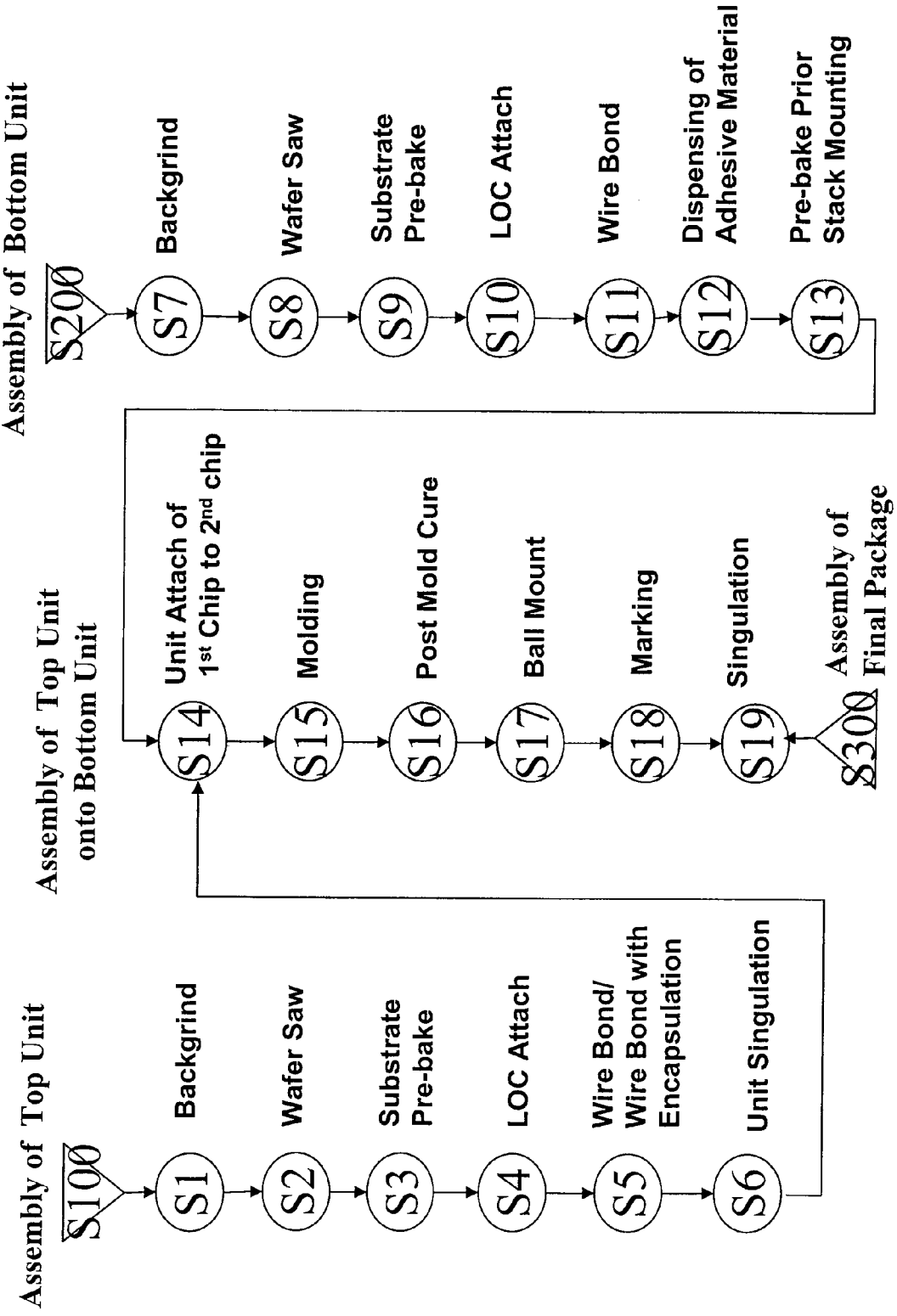
FIG. 14 is a flow chart of a method of manufacture according to FIG. 13.

FIG. 14 is a flow chart of the method of manufacture for an IC chip package in accordance with FIG. 13. As can be seen in FIG. 14, the assembly of the chip package comprises the assembly of the top chip unit S100 assembly of a bottom chip unit S200 and a assembly of the final package S300.

As shown in FIG. 14, steps S1 and S7 comprise grinding the wafers. Raw wafer can come in various thickness. The wafer must be grinded to desired thickness to suit for specific package thickness. In steps S2 and S8 the respective wafers grinded wafers are sawed into individual dice, for example by using a diamond blade. Then, in steps S3 and S9 the substrate are pre-baked in order to remove moisture. In steps S4 and S10 Lead On Chip (LOC) is used to attach the singulated die onto the respective substrates.

After the die is attached to the respective substrates wire bonding is performed in steps S11 and S5. The top unit is then singulated in step S6. Preparation of the bottom unit proceeds in step S12, wherein the adhesive material is dispensed. After the adhesive material is dispensed on the bottom chip unit, the bottom chip unit is pre-baked S13. After the individual assembly of the top and bottom chip units, the two chip units are attached together in Step S14.

Once the top and bottom chip units are attached, there are several processing steps performed on the attached chip unit to complete the assembly of the final package S300. Initially, molding using an encapsulation process, is performed on the attached chip units S15. The assembled unit may be molded by encapsulating it with Epoxy Mold Compound (EMC). Then a post mold curing process S16 allows cross-linking of the EMC. This can be accomplished, for example, by oven heat curing the encapsulated package for 2 to 6 hours at 180° C. After the post mold curing process, solder balls are mounted onto a solder pad of substrate S17 for later interconnection to PCB.

Then, in step S18, the package is marked for identification purposes, for example by laser or ink marking. The molded strip is then singulated into a specific package size S19 to complete the assembly.

Figure 15:
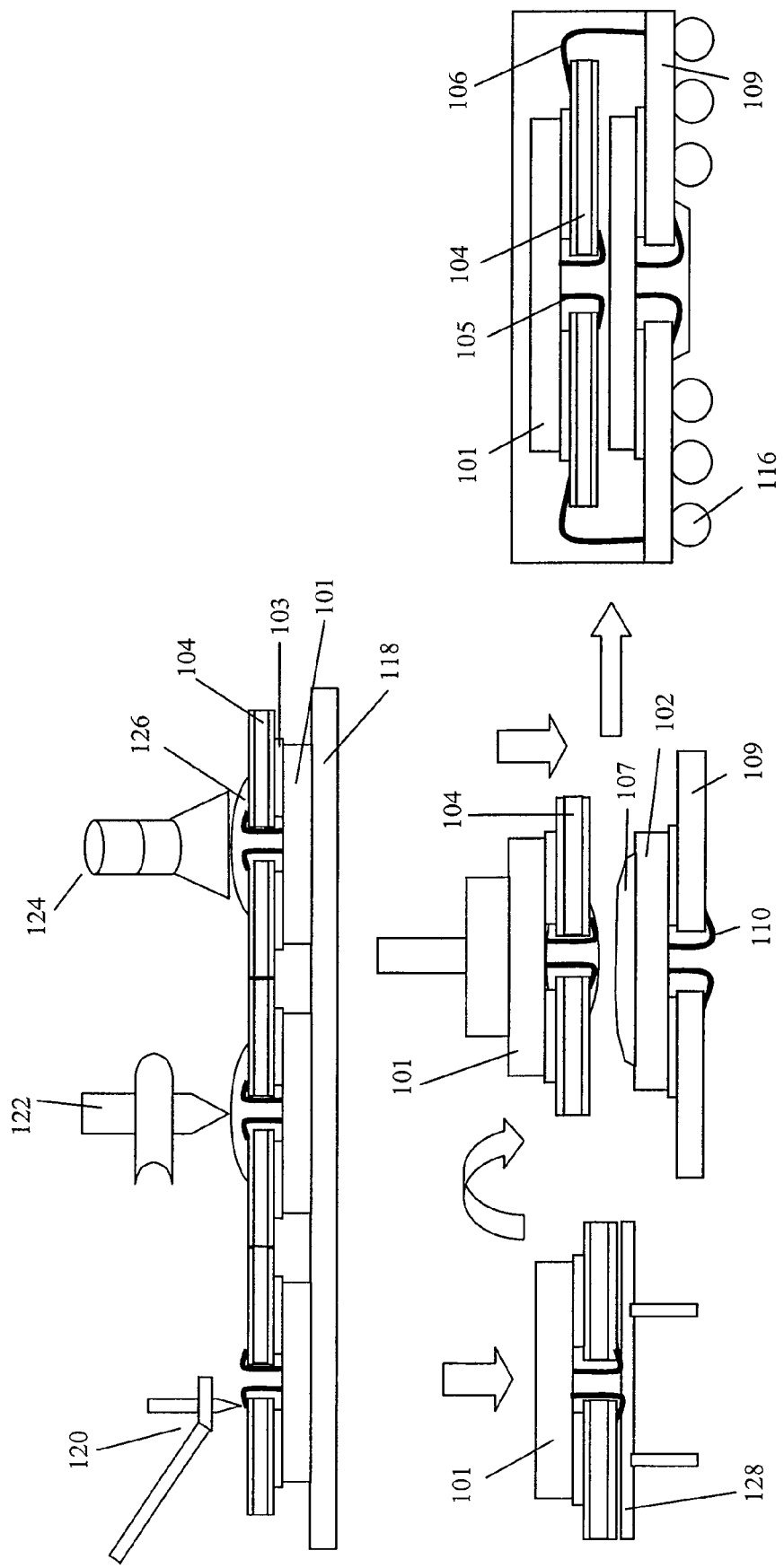
FIG. 15 is a modification of the method of FIG. 13.

FIG. 15 illustrates a method of chip package manufacture similar to FIG. 13, except that in the method of FIG. 15, the wire bonding 105 may be secured before ejecting the chip unit including IC chip 101 and substrate 104 from the mounting tape 118. Additionally, in the exemplary embodiment of FIG. 15, the chip unit does not have to be flipped. Instead, after the chip unit is ejected, the chip unit may be laterally moved. In the exemplary embodiment of FIG. 15, a wire bonding device 118 bonds the bonding wires to the IC chip. Then a dispenser 122 dispenses a material, for example an epoxy 126, to secure the bonded wires. After the epoxy 126 is deposited on the wire bond 105, it is cured, by a curing device 124 so that the epoxy securely hold the wire bonding. Curing the epoxy 126 may be done by, for example, heat or UV light. Securing the wire bonding 105 before singulating the IC chips prevents disturbing the wire during singulation and attaching a top chip unit to a bottom chip unit. Also, the method shown in FIG. 15 does not require flipping the chip unit after it is singulated.

Figure 9:
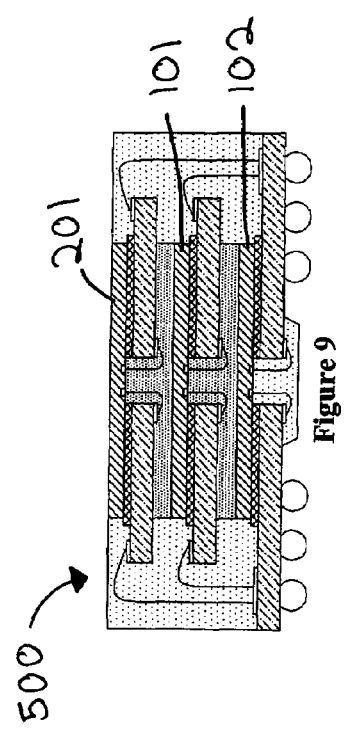
FIG. 9 is an exemplary embodiment of an IC chip package in which three IC chips are included in the same package.

The exemplary embodiments described above are applied to forming an IC chip package including two IC chips. However, the same processes may be applied to more than two IC chips, the particular number not being limited. For example, as shown in FIG. 9, there may also be a third IC chip 201 so that a single package 500 includes three IC chips.

Figure 10:
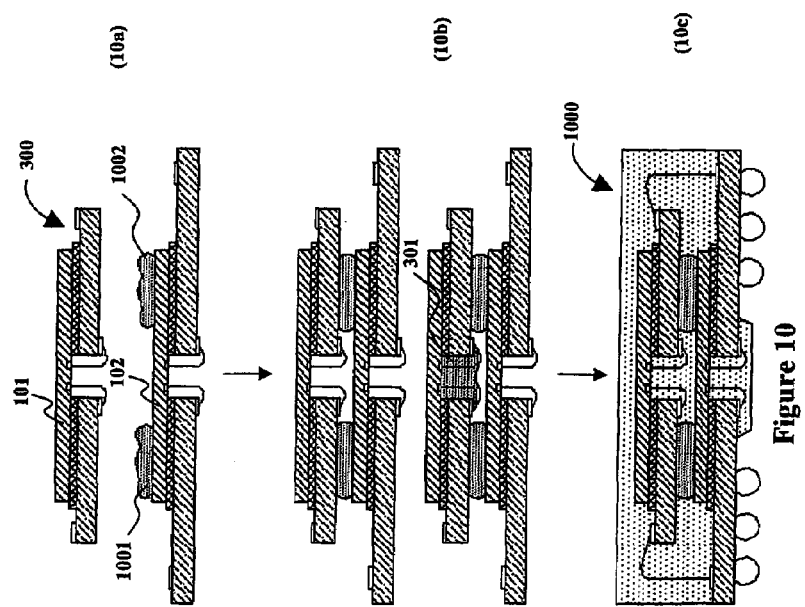
FIG. 10 is a modification of the method of attaching IC chips through an adhesive component.

FIGS. 10a, 10b and 10c show an alternative method of forming the earlier described IC chip packages. As shown in FIGS. 10a-10c, rather than depositing an adhesive 107 in the center of the IC chip 102, a non-conductive adhesive component 1001, 1002 can be disposed at the edges of a surface of the IC chip 102. FIG. 10a illustrates two portions of adhesive component 1001, 1002 being dispensed on the back of IC chip 102. As shown in FIG. 10b, the attachment of the IC Chip 101 to the IC chip 102 is done after the adhesive components 1001, 1002 are dispensed on Chip 102 and promote the attachment. As shown in FIG. 10b, non-conductive element 301 may be used to cover the bonding wires as, as described earlier. FIG. 10c illustrates the completed IC package 1000 which results when using the method shown in FIGS. 10a and 10b and described above.

Figure 11:
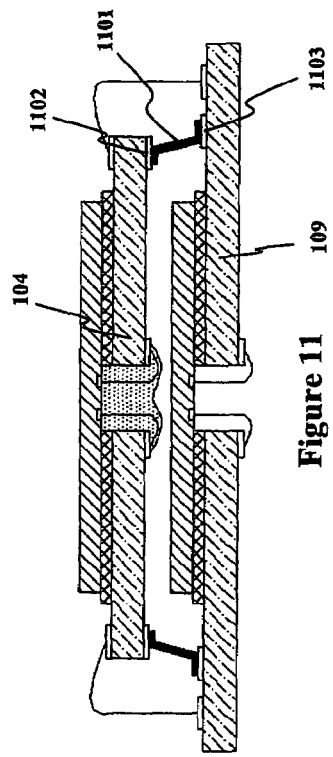
FIG. 11 is an exemplary embodiment of an IC chip package including a mechanical structure for spacing the substrates of two IC chips in the package.

FIG. 11 shows another alternative exemplary embodiment of the invention. In the exemplary embodiment shown in FIG. 11, a mechanical structure 1101 is present between substrate 104 and substrate 109. The mechanical structure 1101 may in form of metal, copper alloys, polymers etc. The material used is not particularly limited as long as the mechanical structure 1101 may serve its purpose of holding the substrate 104 so as to maintain specific clearance between the substrate 104 and the substrate 109.

Figure 12:
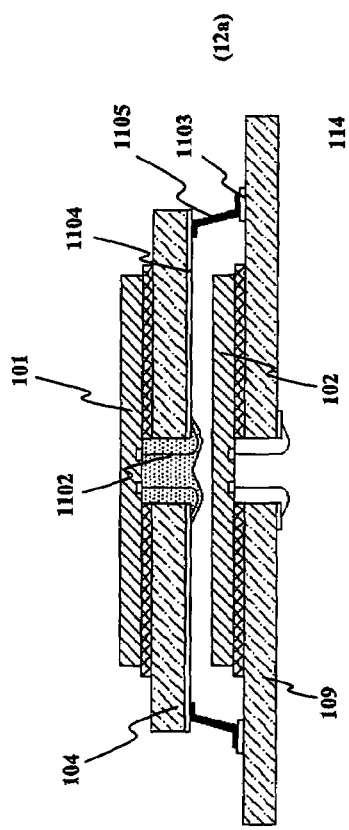
FIGS. 12a and 12b are exemplary embodiments of an IC chip package in which a mechanical structure spaces the two substrates of an IC chip package.
Figure 12:
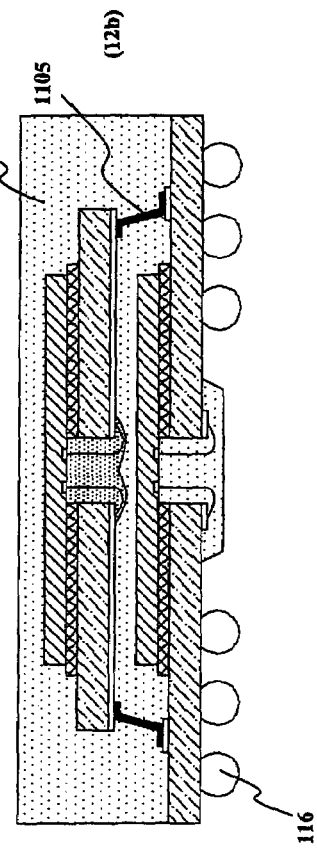

FIG. 12(a) shows another exemplary embodiment of the invention. In the exemplary embodiment of FIG. 12a, in addition to providing a clearance, mechanical structure 1105 also serves as an electrical conductor. In this manner, a continuous electrical path is formed so that an electrical signal can be carried from the IC chip 101, through the wire 1102 to the conductive element 1104, which is attached to the mechanical structure 1105 which is in turn connected to conductive element 1103 which is attached to substrate 109. The mechanical structure 1105 serves as a bridge connecting the two conductive element 1104 and 1103 disposed on substrate 104 and 109, respectively.

FIG. 12b shows the final package which includes the mechanical structure 1105 which serves as an electrical conductor. In the case where the mechanical structure 1105 serves as an electrical conductor, the use of bonding wire to electrically connect the substrates 109 and 104 can be eliminated. FIG. 12b also shows the entire package with encapsulation 114 and including solder balls 116 on a bottom surface of substrate 109. In this configuration, the signal brought out of IC chip 101 can be connected to solder balls 116 disposed below the substrate 109.

Figure 16:
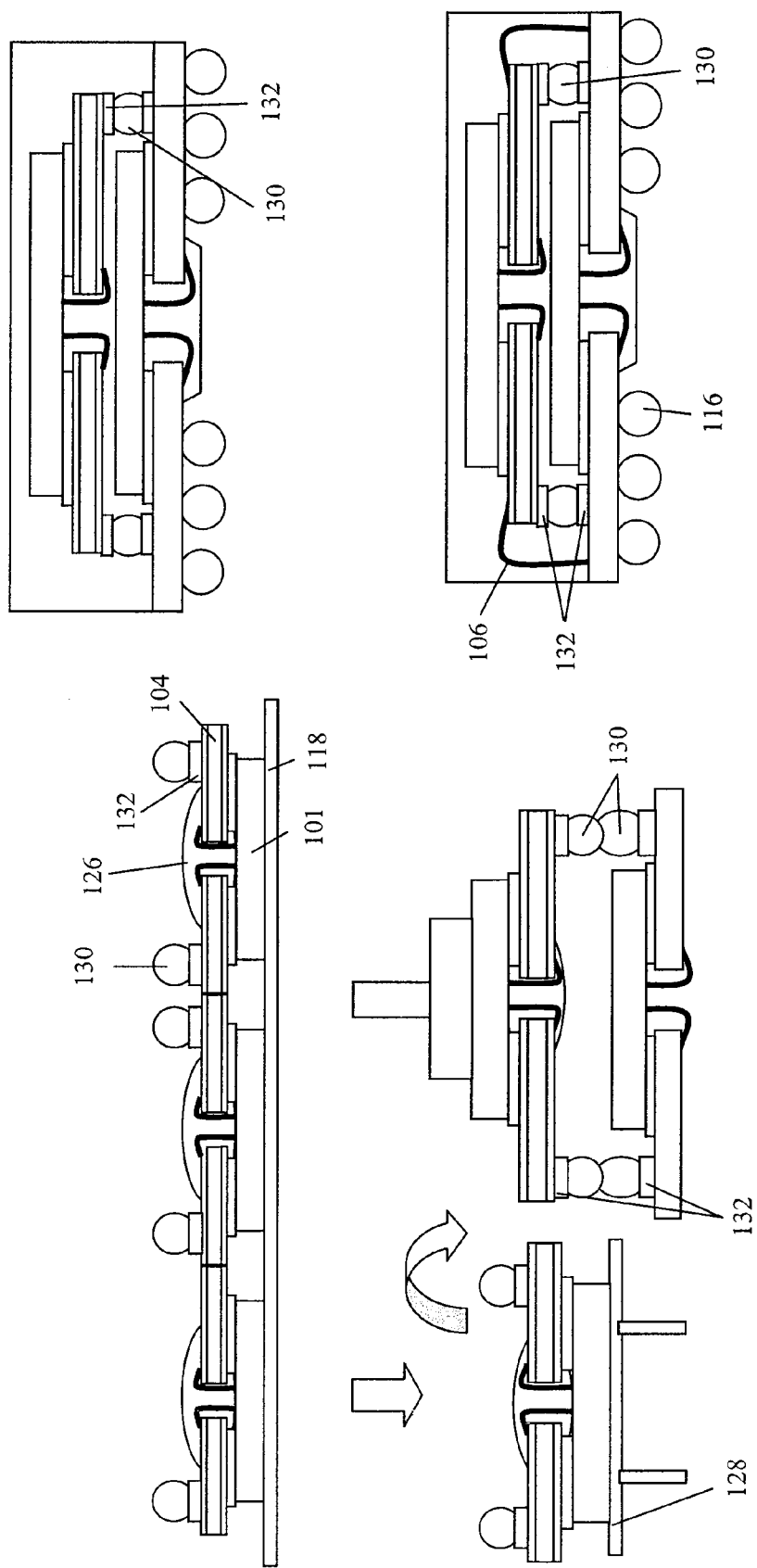
FIG. 16 illustrates a modification of FIG. 12 in which spacing between two substrates in a IC chip package is provided by pre-solder.

Another method of maintaining a clearance between the substrates is shown in FIG. 16. As seen in the FIG. 16, an alternative to the mechanical structures 1101 and 1105, shown in FIGS. 11 and 12a, 12b respectively, is the use of solder balls 130. As shown in FIG. 16, solder balls 130 may be disposed on solder pads 132 on the IC chip units before assembling them. Then, similar to the methods of FIG. 13 or 15, the chips may be singulated by an ejector 128. As explained above, singulation can be achieved in several manners, such as through snap break or laser cut technology. After the chips are singulated, the chips are mounted on one another. As the solder balls 130 on each of the chip units contacts the other, a mechanical connection is achieved. Similar to the mechanical structure 1105, the mechanical connection of the pre-solder maintains a clearance between the substrates and may be used to provide an electrical interconnection between the substrates and ultimately from IC chip 101 to solder balls 116 disposed below the substrate 109.

Figure 17:
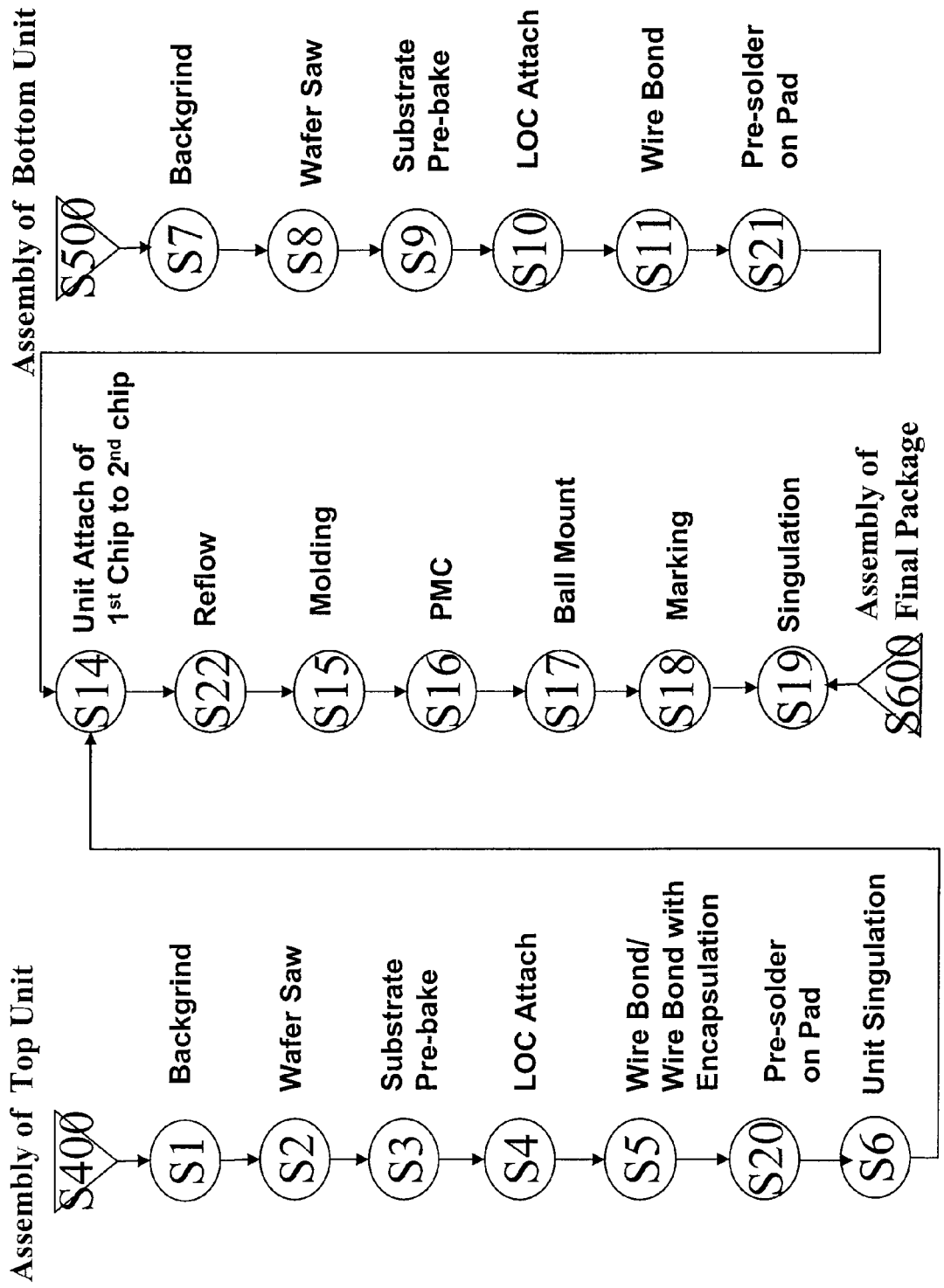
FIG. 17 is a flow chart of a method of manufacture according to FIG. 16.

FIG. 17 is a flow chart particularly describing the method of manufacture according to FIG. 16. The method includes assembly of a top chip unit S400, assembly of a bottom unit chip unit S500 and assembly of the final package S600. Many of the steps are the same as in the assembly according to FIG. 14, and therefore their explanation will be omitted. In addition to the steps shown in FIG. 14, the assembly according to FIG. 17 also includes steps S20, S21 of depositing pre-soldering on the pads during the assembly of the top and bottom chip units, respectively. This provides the solder balls 130 which serve as a spacer as shown in FIG. 16. Additionally, assembly of the final package also includes the step S22 of reflowing the solder on the pads to join the solder balls attached to each chip unit. This ensures the interconnection between the solder balls.

What is claimed is:

1. A method of forming a chip package comprising:
   providing a first chip unit comprising a first IC chip and a first substrate, wherein the first IC chip is electrically connected to the first substrate through an opening in the first substrate;
   providing a second chip unit comprising a second IC chip and a second substrate, wherein the second IC chip is electrically connected to the second substrate through an opening in the second substrate;

wherein each of the first substrate, the first IC chip, the second substrate and the second IC chip have first and second planar surfaces and the second planar surface of the first IC chip is mounted to the first planar surface of the first substrate and the second planar surface of the second IC chip is mounted to the first planar surface of the second substrate; wherein the method further comprises providing an adhesive on the first planar surface of the second IC chip; and mounting the second planar surface and the opening of the first substrate on the adhesive on the first planar surface of the second IC chip;

wherein at least a portion of the second planar surface and the opening of the first substrate which contacts the adhesive is unencapsulated before mounting; and wherein the unencapsulated portion of the second planar surface and the opening of the first substrate is encapsulated by the adhesive after mounting.

2. The method of claim 1, wherein the entire second planar surface of the first substrate is unencapsulated before mounting.

3. The method of claim 1, further comprising providing the first chip unit by singulating the first chip unit from a series of chip units.

4. The method of claim 3, wherein the singulating of the first chip unit is performed by at least one of snap break or laser cut technology.

5. The method of claim 3, further comprising electrically connecting the first substrate and the first IC chip through bonding wire formed before singulating of the first chip unit.

6. The method of claim 5, further comprising a step of securing the bonding wire before singulating the first chip unit.

7. The method of claim 6, wherein securing the bonding wire comprises dispensing epoxy on the bonding wire and curing the epoxy.

8. The method of claim 7, wherein the epoxy is dispensed only over the bonding wire.

9. The method of claim 3, further comprising the first chip unit moving only laterally after the step of singulating the first chip unit and before the step of mounting on the second chip unit.

10. The method of claim 3, further comprising flipping the first chip unit after the step of singulating the first chip unit and before the step of mounting the first chip unit on the second chip unit.

* * * * *